(12) United States Patent
Koyama et al.

(10) Patent No.: US 9,957,613 B2
(45) Date of Patent: May 1, 2018

(54) LAMINATE, BARRIER FILM AND METHOD FOR MANUFACTURING THESE

(71) Applicant: Toppan Printing Co., Ltd., Taito-ku, Tokyo (JP)

(72) Inventors: Hiroshi Koyama, Tokyo (JP); Jin Sato, Tokyo (JP); Mitsuru Kano, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 182 days.

(21) Appl. No.: 14/866,407

(22) Filed: Sep. 25, 2015

(65) Prior Publication Data

US 2016/0017491 A1 Jan. 21, 2016

Related U.S. Application Data

(63) Continuation of application No. PCT/JP2014/057699, filed on Mar. 20, 2014.

(30) Foreign Application Priority Data

Mar. 27, 2013 (JP) .................................. 2013-066165
Dec. 25, 2013 (JP) .................................. 2013-267184

(51) Int. Cl.
| | | |
|---|---|---|
| *C23C 16/455* | (2006.01) | |
| *C23C 16/02* | (2006.01) | |
| *C23C 16/40* | (2006.01) | |
| *C23C 16/04* | (2006.01) | |
| *B32B 27/06* | (2006.01) | |
| *B32B 27/30* | (2006.01) | |

(52) U.S. Cl.
CPC ........ *C23C 16/45525* (2013.01); *B32B 27/06* (2013.01); *B32B 27/308* (2013.01); *C23C 16/0272* (2013.01); *C23C 16/04* (2013.01); *C23C 16/401* (2013.01); *C23C 16/403* (2013.01); *C23C 16/405* (2013.01); *B32B 2307/7244* (2013.01); *B32B 2457/20* (2013.01)

(58) Field of Classification Search
CPC .............. C23C 16/45525; C23C 16/04; C23C 16/0272; C23C 16/401; C23C 16/405
See application file for complete search history.

(56) References Cited

U.S. PATENT DOCUMENTS

| | | |
|---|---|---|
| 2011/0234706 A1 | 9/2011 | Yoshida et al. |
| 2011/0236706 A1 | 9/2011 | Uebayashi et al. |
| 2014/0141218 A1* | 5/2014 | Yoshihara ............. C23C 16/403 428/213 |

FOREIGN PATENT DOCUMENTS

| | | |
|---|---|---|
| JP | 2007-516347 A | 6/2007 |
| JP | 2008-532271 A | 8/2008 |
| JP | 2011-518055 A | 6/2011 |
| JP | 2011-173261 A | 9/2011 |
| JP | 2012-096431 A | 5/2012 |
| WO | WO 2013/015412 A1 | 1/2013 |
| WO | WO 2013/015417 A1 | 1/2013 |

OTHER PUBLICATIONS

Office Action issued in corresponding Taiwanese patent application No. 103111165 dated Aug. 10, 2017—(with English translation).
International Search Report dated Jun. 3, 2014 issued in PCT/JP2014/057699.

* cited by examiner

*Primary Examiner* — Robert Harlan
(74) *Attorney, Agent, or Firm* — Foley & Lardner LLP

(57) ABSTRACT

A laminate includes: a base material having a top surface; an under coat layer formed on at least a part of the top surface of the base material, having a membranous shape or a film shape and containing an organic polymer having an OH group; and an atomic layer deposition film formed in a membranous shape to cover an exposed surface of the under coat layer, the atomic layer deposition film being formed by a precursor as a material thereof. At least a part of the precursor is coupled to the OH group of the organic polymer.

16 Claims, 4 Drawing Sheets

(a) METHYL GROUP (b) ESTER GROUP number of supplies of precursor [times]

LAMINATE, BARRIER FILM AND METHOD FOR MANUFACTURING THESE

CROSS-REFERENCE TO RELATED PATENT APPLICATIONS

This application is a continuation application filed under 35 U.S.C. 111(a) claiming the benefit under 35 U.S.C. § § 120 and 365(c) of PCT International Application No. PCT/JP2014/057699 filed on Mar. 20, 2014, which is based upon and claims the benefit of priority of Japanese Application No. 2013-066165 filed on Mar. 27, 2013, and Japanese Application No. 2013-267184 filed on Dec. 25, 2013, the entire contents of all of which are hereby incorporated by reference in their entireties.

BACKGROUND

The present invention relates to a laminate, a barrier film and a manufacturing method thereof.

A method for forming thin films on a surface of material includes CVD (Chemical Vapor Deposition) and PVD (Physical Vapor Deposition), in which vapor allows substances to move at an atomic level or molecular level like a gas.

As a typical PVD method, a vacuum evaporation method or a sputtering method has been employed. Specifically, in the sputtering method, generally, even though the apparatus is costly, high quality thin films can be formed with film properties including excellent uniformity and film thickness. Hence, the sputtering method has been widely used for liquid crystal display devices and display devices.

Meanwhile, in the CVD method, raw material gas is introduced in the vacuum chamber and one or two or more types of gasses are decomposed or reacted on the substrate by thermal energy so as to grow a solid thin film. When decomposing or reacting gasses, to accelerate the reaction during the film formation or to lower the reaction temperature, a plasma or a catalyst reaction may additionally be used, which are referred to as PECD (Plasma Enhanced CVD) and Cat-CVD respectively. Such CVD methods produce fewer defects during the film formation and are mainly used for manufacturing processes of semiconductor devices, for example, a film-forming process of the gate insulation layers.

In recent years, an ALD method (Atomic Layer Deposition) is attracting attention. The ALD method is a method in which surface-adsorbed material is formed at an atomic level, layer by layer by a chemical reaction on the surface thereof, and is categorized as a CVD method. The ALD method is distinguished from a general CVD method. In a so-called CVD method (general CVD method), a thin film is grown by a reaction on the substrate by using a single gas or plural gasses. In contrast, the ALD method is a specific method, that is, the ALD method uses highly active gas such as a precursor (TMA: Tri-Methyl Aluminium) and a reactive gas (also referred to as a precursor in the ALD method) alternately, and by using surface-adsorption on the substrate and the subsequent chemical reaction, a thin film is grown at an atomic level layer by layer.

As a disadvantages of the ALD method, to perform the ALD method, specific material has to be used, which causes an increase of cost. Further, perhaps the greatest disadvantage is that a rate of film-formation is low. For example, compared to a regular vacuum evaporation method or a regular sputtering method, the rate of film-formation is 5 to 10 times lower.

To obtain excellent films by using the ALD method, it is important to try to improve processes of the ALD method and also a pre-process of the ALD method (for example, refer to patent literature 1: PTL1). PTL 1 discloses a technique in which a plasma treatment is applied to an insulation layer on a semiconductor substrate thereby improving step coverage of a film formed by the subsequent ALD method.

As a related art, a technique is disclosed in which atomic layer deposition is performed so as to form a gas-permeable barrier layer on a plastic substrate or a glass substrate (For example, refer to patent literature 2: PTL 2). In PTL 2, a light-emitting polymer is mounted on a plastic substrate having optical transparency and an atomic layer deposition is performed on a top surface and a side surface of the light-emitting polymer by the ALD method (i.e., a top coating is applied). Thus, a technique achieving a barrier film having optical transparency is disclosed in which coating defects can be reduced and gas permeation through several dozens of nanometer of thickness can be remarkably reduced.

PATENT LITERATURE

[PTL 1] Japanese Unexamined Patent Application Publication No. 2008-532271
[PTL 2] Japanese Unexamined Patent Application Publication No. 2007-516347
[PTL 3] Japanese Patent Application Laid-Open Publication No. 2012-96431
[PTL 4] International Publication No. 2013/015412

SUMMARY OF THE INVENTION

As described above, conventionally, laminates having an atomic layer deposition film on an outer surface of the substrate, formed by the ALD method, have been widely known. These laminates are often used for a gas barrier film having gas barrier properties.

However, in the above-described laminate which has conventionally been known, the atomic layer deposition film is laminated on a polymer base material and the growth form is very likely different from a case where an inorganic crystal such as a conventional-type silicon wafer is used for the base material. When using a silicon wafer as a substrate where an oxidation treatment is applied, an adsorption site of the precursor has a similar density to the crystal lattice and the film is grown in a two-dimensional growth mode. However, in a case where a polymer base material is used, since the distribution density of the adsorption site of the precursor is low, precursor adsorbed distantly-separated sites as a nucleus grows and expands three-dimensionally. Hence, adjacent nuclei are very likely to contact each other to form a continuous film. Further, depending on the state of the base material and the process conditions of the ALD, the film is very likely to grow in a column shape from the outer surface of the base material towards a direction perpendicular to the outer surface of the base material. In other words, the above-described conventional laminate is formed such that a plurality of column shape structures are arranged on the base material so that a gas may flow into or out of the laminate via gaps between the column shape structures. In other words, the above-described laminate may not have ideal gas barrier properties.

In a case where no ideal adsorption site exists on the polymer base material, the laminate may not be formed on the polymer base material by using the ALD method.

In patent literature 4, a method is disclosed in which an undercoat layer is implemented on the polymer base material and a nucleophilic group having high reactivity is implemented at a high density. However, this method is performed in an offline step so that a functional group having high reactivity in the top surface reacts with substances in the atmosphere and may cause inactivation and contamination on the top surface of the undercoat layer.

The present invention is achieved in light of the above-described circumstances and its object is to provide a laminate with high gas barrier properties.

To solve the above-described problems, the present invention employs the following configurations.

A laminate according to a representative first aspect of the present invention includes: a base material having a top surface; an under coat layer formed on at least a part of the top surface of the base material, having a membranous shape or a film shape and containing an organic polymer having an OH group; and an atomic layer deposition film formed in a membranous shape to cover an exposed surface of the under coat layer, the atomic layer deposition film being formed by a precursor as a material thereof. Also, at least a part of the precursor is coupled to the OH group of the organic polymer.

The organic polymer may be a copolymer of poly (methacrylic acid-2-hydroxyethyl) and polymethylmethacrylate.

The poly (methacrylic acid-2-hydroxyethyl) of the copolymer may be contained in the copolymer in a ratio of 15 mol % to 50% mol.

A part of the OH group contained in the poly (methacrylic acid-2-hydroxyethyl) may be cross-linked to form a three-dimensional mesh structure.

The laminate according to a representative second aspect of the present invention includes: a polymer base material having a top surface; an under coat layer formed on at least a part of the top surface of the polymer base material, having a membranous shape or a film shape and containing an organic polymer; an adhesive layer formed to cover a top surface of the under coat layer, containing a functional group having nucleophilicity, wherein at least an element ratio O/C which is a ratio between an oxygen O and an carbon C, or an element ratio N/C which is a ratio between a nitrogen N and a carbon C is higher than that of the under coat layer; and an atomic layer deposition film formed using a precursor as a material thereof to cover a top surface of the adhesive layer. Further, at least a part of the precursor is coupled to the functional group having nucleophilicity.

Also, the under coat layer may include an element or a functional group which contains a non-covalent electron pair.

A film thickness of the adhesive layer may be in a range from 0.1 nm to 100 nm.

A film thickness of the under coat layer may be in a range from 100 nm to 100 μm.

A film thickness of the atomic layer deposition film may be in a range from 2 nm to 50 nm.

The atomic layer deposition film may contain at least either Al or Si.

The atomic layer deposition film may contain Ti on a top surface that contacts the adhesive layer.

A gas barrier film according to a representative third aspect of the present invention includes laminates formed in a film shape of the above-described aspects.

A method of manufacturing the laminate according to a representative fourth aspect of the present invention includes steps of: preparing a base material; forming an under coat layer on at least a part of a top surface of the base material, having a membranous shape or a film shape and containing an organic polymer having a functional group; surface-treating a part of an exposed surface of the under coat layer and densifying the functional group of the organic polymer; supplying a precursor material on the exposed surface such that a precursor that becomes an atomic layer deposition film is coupled to an OH group and a densified functional group of the organic polymer contained in the under coat layer; and removing, from the precursor material, excess precursor material which is not coupled to the under coat layer and saturating a coupling amount of the precursor which is coupled to the OH group of the organic polymer and the densified functional group of the organic polymer, thereby forming the atomic layer deposition film.

A method of manufacturing the laminate according to representative fifth aspect of the present invention includes steps of: preparing a base material; forming an under coat layer on at least a part of a top surface of the base material, having a membranous shape or a film shape and containing an organic polymer having a functional group; surface-treating at least a part of an exposed surface of the under coat layer, thereby forming an adhesive layer having a functional group having nucleophilicity; supplying a precursor material on a top surface of the adhesive layer such that a precursor that becomes an atomic layer deposition film is coupled to the functional group of the under coat layer or the functional group having nucleophilicity of the adhesive layer; and removing, from the precursor material, excess precursor material which is not coupled to the under coat layer and the adhesive layer and saturating a coupling amount of the precursor which is coupled to the functional group of under coat layer or the functional group having nucleophilicity in the adhesive layer, thereby forming the atomic layer deposition film.

In a method of manufacturing a gas barrier film according to a representative sixth aspect of the present invention, the laminate manufactured by the method of manufacturing the laminate according to the above-described aspects is formed in a film shape.

According to the above-described aspects, even in the atomic layer deposition method using a polymer as a base material, the adsorption sites of the precursor can be arranged densely by the under coat layer containing the organic polymer having the OH group so that an atomic layer growth similar to the two-dimensional growth can be performed. Further, according to the above-described aspects, even in the atomic layer deposition method using a polymer as a base material, by using the under coat layer containing functional groups having high reactivity and the adhesive layer containing more functional groups having high reactivity, an atomic layer growth similar to the two-dimensional growth can be performed.

Furthermore, according to the above-described aspects, since the atomic layer deposition film is a membrane in which the atoms are densely coupled in the surface direction, gaps allowing the gas to permeate in the thickness direction are very few. Therefore, gas barrier properties of the laminate or the gas barrier film can be enhanced.

DETAILED DESCRIPTION

Hereinafter all of the following are representative examples of the present invention, but the examples are not limited thereto. Now a representative first embodiment of the present invention is described.
(Configuration of a Laminate According to the First Embodiment)

Figure 1:
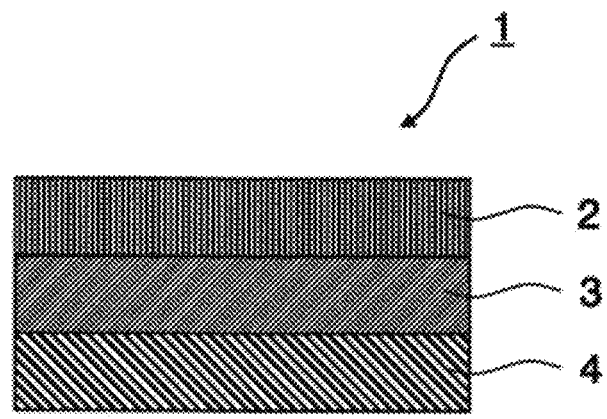
FIG. 1 is a cross sectional view showing a configuration according to the first embodiment of the present invention.

First, a configuration of the laminate according to the first embodiment of the present invention is described. FIG. 1 is a cross sectional view showing a configuration of the laminate according to the first embodiment of the present invention. As shown in FIG. 1, the laminate 1 includes a base material 4 made of polymer; an undercoat layer 3 (hereinafter referred to as UC layer) formed on the top surface of the base material 4, having a membranous shape or a film shape; and an atomic layer deposition film 2 (hereinafter referred to as a ALD film) formed on a surface (on the top surface of the UC layer 3) opposite to a surface contacted to the base material 4 in both surfaces in the thickness direction of the UC layer 3. The UC layer 3 contains an organic polymer having an OH group and secures an adsorption site of the ALD film. Specifically, the organic polymer contained in the UC layer 3 contains a functional group where the precursor of the ALD film 2 is easily adsorbed. Accordingly, the precursor which is a material of the ALD film 2 binds with the OH group of the organic polymer contained in the UC layer 3, thereby forming the ALD film 2 in a membranous shape to cover the UC layer 3.

Figure 2:
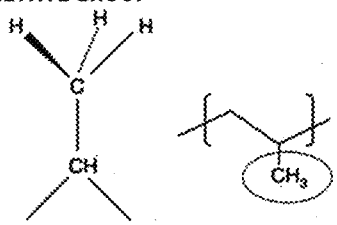
FIG. 2A is a diagram showing a chemical formula of the methyl group which is a polymer that constitutes a base material according to the first and second embodiments of the present invention.
FIG. 2B is a diagram showing a chemical formula of the ester group which is a polymer that constitutes a base material according to the first and second embodiments of the present invention.
Figure 2:
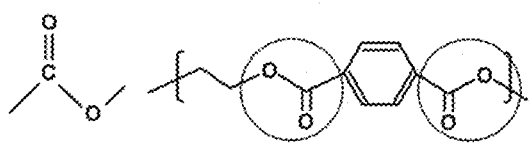

The base material 4 made of polymer will now be described. FIG. 2A and FIG. 2B are diagrams showing chemical formulas of the functional group of the polymer that constitutes the base material 4.

As shown in FIG. 2A, when polypropylene (PP) having no polar group such as the OH group but having the methyl group is used for the base material, initial growth rate in the film formation of the ALD film (i.e., adsorption rate of the precursor) is slower than $Al_2O_3$ (alumina). In other words, when using PP for the base material, since the functional group is the methyl group, precursor adsorption is difficult. Accordingly, as a polymer used for the base material, PP is not preferable.

Meanwhile, as shown in FIG. 2B, when polyethylene terephthalate (PET) having a polar group such as an ester group is used for the base material, an initial growth rate in the film formation of the ALD film (i.e., adsorption rate of the precursor) is faster than $Al_2O_3$ (alumina). In other words, when using PET for the base material, since the functional group is an ester group, the precursor is easily adsorbed. Accordingly, as a polymer used for the base material, the PET is preferable.

That is, it is not preferable to use PP having methyl groups in which the precursor is adsorbed with difficulty, to be the base material 4. Meanwhile, it is preferable to use PET having the ester group in which the precursor is easily adsorbed, for the base material 4. In other words, polarity of the functional group and presence of atoms that supply electrons or the like significantly influence the adsorption rate of the precursor. Therefore, when using a polymer such as PP for the base material 4, the ALD film 2 is difficult to form directly on the base material 4. Accordingly, in this case, the UC layer 3 is preferably disposed on the base material 4 and the ALD film 2 is preferably disposed on the UC layer 3.

When the UC layer 3 is formed on the base material 4, the ALD film 2 can be formed densely so that a polymer only having hydrocarbon such as the polyethylene (PE), the polypropylene (PP) or polystyrene (PS) may be used. Even in a case where the UC layer 3 is formed on the base material 4, a polymer containing O atoms such as polyethylene terephthalate (PET), N atoms such as nylon or S atoms such as polyethersulfone may be used.

Figure 3:
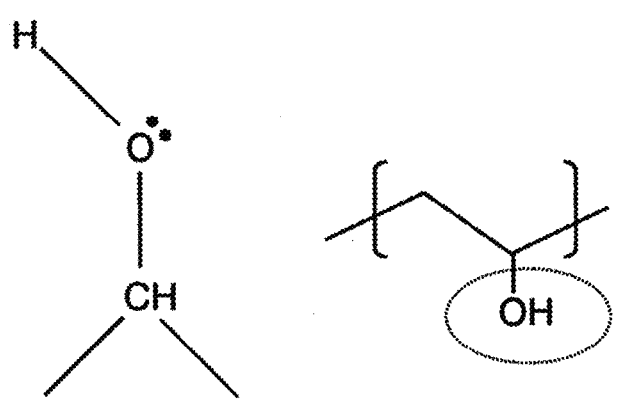
FIG. 3 is a diagram showing a chemical formula of an organic polymer containing the OH group.

Hereinafter will be described an organic polymer contained in the UC layer 3, having the OH group, which the ALD film 2 easily adsorbs on. FIG. 3 is a diagram showing a chemical formula of an organic polymer containing the OH group. As the organic polymer contained in the UC layer 3, when polyvinylalcohol (PVA) as shown in FIG. 3 is used, an initial growth rate in the film formation of the ALD film (i.e., adsorption rate of the precursor) is faster. In other words, when PVA is used as a material of the organic polymer of the UC layer 3, since the functional group is the hydroxyl group, the precursor may easily be adsorbed. Therefore, the PVA may preferably be used as the organic polymer used for the UC layer 3.

As an organic polymer having OH groups suitable for the UC layer 3, phenol resin or a polysaccharide other than polyvinyl alcohol as shown in FIG. 3 can be used. As a specific example of the polysaccharide, cellulose derivatives such as cellulose, hydroxymethyl cellulose, hydroxyethyl cellulose or carboxymethyl cellulose, chitin and chitosan may be used. Other than these, as a material for the UC layer 3, a copolymer of the above-described organic polymer and other organic polymer or a hybrid material containing the above-described organic polymer and inorganic material may be used.

Further, as other materials of the UC layer 3, an epoxy resin having the OH group and an acrylic resin may be used. Among these, a copolymer of poly (methacrylic acid-2-hydroxyethyl) and polymethylmethacrylate may preferably be used. In this case, when the poly (methacrylic acid-2-hydroxyethyl) is contained in the copolymer in the ratio of 15 mol % to 50% mol, a sufficient amount of adsorption sites can be provided and coating can be performed with various solvents.

Further, the molecules of organic polymer having the OH group contained in the UC layer 3 may preferably be cross-linked. Thus, a three-dimensional mesh structure is formed in the UC layer 3 so that heat and humidity tolerance of the laminate 1 is enhanced. As a material for cross-linking in the molecules of the organic polymer having the OH group, an organic polymer having NCO group such as Sumidur N 3300 (Sumitomo Bayer Urethane Co. Ltd.) is used. By adding the organic polymer containing NCO groups, the NCO group and at least some of the OH group in the UC layer 3 are reacted, whereby a cross-linking reaction between molecules occurs. Thus, the three-dimensional mesh structure is formed in the UC layer 3 so that heat and humidity tolerance of the laminate 1 is enhanced.

The ALD film 2 may be formed of an inorganic oxidation film such as $AlO_x$, $TiO_x$, $SiO_x$, $ZnO_x$ or $SnO_x$, a nitride constituted by these inorganic materials or an oxynitride film. Moreover, the ALD film 2 may be formed by the above-described films or a mixed film of elements.

In the laminate 1 constituted by the base material 4, the UC layer 3 and the ALD film 2, the precursor which is a material of the ALD film 2 can be arranged with a high density at the adsorption sites of the UC layer 3, allowing subsequent atomic later growth of the ALD film 2 which is similar to a two-dimensional growth. The ALD film 2 formed two-dimensionally is a film in which atoms are coupled densely in a surface direction. Therefore, since only a few gaps allowing gas to permeate in a film-thickness direction exist, the gas barrier properties can be enhanced. Accordingly, the laminate 1 is formed in a film shape to be used as a gas barrier film.

(Manufacturing Method of a Laminate According to the First Embodiment)

Hereinafter will be described a manufacturing method of the laminate according to the first embodiment of the present invention. First, the base material 4 made of polymer is mounted in a vacuum chamber of the ALD apparatus (first process). Subsequently, an UC layer 3 is formed at least on an outer surface (top surface) of the base material 4 (second process). The UC layer 3 is formed in a membranous shape or a film shape, containing an organic polymer having OH groups. Next, a surface treatment is applied to a part of a surface opposite to a surface contacted to the base material 4 (exposed surface of UC layer 3), among both surfaces in a thickness direction of the UC layer 3 formed in the second process, thereby increasing a density of the functional group of the organic polymer contained in the UC layer 3 (third process). Next, the material of the precursor is supplied on a surface opposite to a surface contacted to the base material 4 (exposed surface of UC layer 3), among both surfaces in a thickness direction of the UC layer 3 (fourth process) such that a precursor which is a material of the atomic layer deposition film is coupled to the OH group of the functional group contained in the UC layer 3 and the functional group of the organic polymer which is densified at the third process. Lastly, excess material of the precursor which was not coupled in the fourth process is removed. Then, an amount of the precursor coupled to the OH group of the organic polymer and to the functional group of the organic polymer densified at the third process is saturated, thereby forming the atomic layer deposition film (fifth process).

In the second process, the method for forming the UC layer 3 is not limited, however, appropriate coating techniques such as spin coating, roll coating or bar coater can be employed.

In the third process, as a method for surface treatment of a part of the UC layer 3, plasma processing (plasma etching) or alkali processing can be employed. Thus, the OH group and the COOH groups appear on a part of the top surface of the UC layer 3 so that the functional group is densified. As a result, the density where the precursor is coupled to the functional group of the UC layer to be cross-linked becomes high. The precursor is the material of the ALD film 3 being formed in the fourth process and the fifth process. Accordingly, having the functional group of the organic polymer contained in the UC layer 3 densified, the gas barrier properties can be further enhanced.

In the fourth process and the fifth process, as a method for forming the ALD film 3, the atomic layer deposition process is employed. To supply the precursor material (material gas) and to remove excess material of the precursor, a purge gas is supplied. It is considered that the precursor and some of the adsorption sites might not be coupled by only supplying the material of the precursor once and removing. Therefore, the step for supplying the precursor and the step for exhausting and removing the excess precursor are repeatedly performed. Then, an amount of the precursor coupled to the OH group and the functional group of the organic polymer is saturated, thereby forming the ALD film 3. The number of supplies and exhausts of the material of the precursor may preferably be within a range from 1 to 30.

Hereinafter will be described the second embodiment of the present invention.

(Summary of the Second Embodiment)

The laminate according to the second embodiment of the present invention includes an under coat layer and an adhesive layer between the base material and the atomic layer deposition film. The under coat layer contains an organic polymer having a coupled portion where the precursor of the atomic layer deposition film is coupled. In other words, the organic polymer contained in the under coat layer contains many functional groups as a coupled portion which is likely to be coupled with the precursor of the atomic layer deposition film. The adhesive layer is disposed at the top surface layer of the under coat layer, having many more functional groups as a coupled portion which is likely to be coupled with the precursor of the atomic layer deposition film. Hence, the precursors coupled to respective functional groups in the under coat layer or the adhesive layer are coupled to be cross-linked with each other. Thus, the atomic layer deposition film having two-dimensional shape is formed, growing towards the surface direction of the adhesive layer. As a result, gaps allowing gas to permeate in a film-thickness direction of the laminate are difficult to produce so that a laminate having high barrier properties can be produced. It should be noted that inorganic substances can be dispersed in the under coat layer. That is, inorganic substances may be added to the under coat layer, thereby further improving the adsorption density of the precursor of the atomic layer deposition film.

The laminate having an atomic layer deposition film produced by the atomic layer deposition method (ALD method) has been commercially produced as an electronic component substrate such as a glass substrate or a silicon substrate used for a thin film radio wave EL, a display and a semiconductor memory (DRAM). Meanwhile, the target of the base material of the laminate in the second embodiment is a polymer base material having flexibility. However, currently, processes of the ALD method adapted for polymer base materials have not been studied in detail. Accordingly, in the present study, for the polymer base material, it is assumed that the atomic layer deposition film grows similarly to when using the electronic component substrate. Then, considering a growing process of the atomic layer deposition film with respect to the polymer base material, the laminate according to the second embodiment is studied.

Generally, it is considered that the atomic layer deposition film on the electronic component substrate grows two-dimensionally. However, practically, the atomic layer deposition film on a polymer base material (for example, PET: polyethylene terephthalate) does not grow two-dimensionally. In other words, when forming a thin film of the atomic layer deposition film on the polymer base material by using the ALD process, desired two-dimensional growth may not happen. Its major causes may be a density of the adsorption site and an arrangement of the adsorption site on the polymer base material. Due to these causes, with a thin film thickness, performance of the atomic layer deposition film is not sufficient. Hence, the film thickness of the atomic layer deposition film should be 2 nm or more or the number of atomic layers should be 20 or more. Further, in a case where the polymer base material has a prismatic structure, since gas permeates from a boundary portion of the prismatic structure, complete gas barrier cannot be produced.

The first cause which is the density of the adsorption site of the precursor in the atomic layer deposition film is described as follows. The first step of the ALD process method is that a precursor in a gas state (TMA: Tri-Methyl Aluminum) or a precursor containing a metal such as $TiCL_4$ is chemically adsorbed onto the top surface of a polymer base material (hereinafter may be simply referred to as a base material). In this case, the reactivity between the precursor and the functional group of the base material and the density of the functional group significantly influence the chemical adsorption.

For example, when a polymer (copolymer) is employed, as shown in the following formula (1), the precursor in the atomic layer deposition film is adsorbed reversibly at the adsorption site.

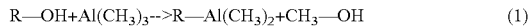

$$R-OH+Al(CH_3)_3 \rightarrow R-Al(CH_3)_2+CH_3-OH \quad (1)$$

That is, in the formula (1), the OH group of the polymer chain is adsorbed at the adsorption site.

The precursor in the atomic layer deposition film can be adsorbed at the adsorption site. However, the atomic layer deposition film is difficult to adsorb on nonpolarized functional groups such as alkyl groups.

When the density of the functional group is low, respective adsorption sites of the precursor are arranged in an isolated manner. Thus, in a case where the respective adsorption sites are isolated, the atomic layer deposition film grows three-dimensionally with the adsorption site as a nucleus. Specifically, when the density of the adsorption site is low, the atomic layer deposition film spreads three-dimensionally with respect to the precursor so that the precursor is adsorbed thinly to portions of the OH group or the like. Accordingly, the atomic layer deposition film grows in a columnar shape with respect to the isolated nucleus as the center of the columnar shape.

The second cause which is an arrangement of the adsorption site of the precursor (i.e., diffusion of precursor) is described as follows. Generally, a polymer film has a crystalline region and a non-crystalline region which are mixed with each other. Hence, in the non-crystalline region, a space called a free volume is present in which the polymer chain is not present. Through the space, gas diffuses and permeates. The precursor in a gas state permeates through the free space until reaching the adsorption site.

According to the reasons as described above, in a process of the ALD process method adapted for the polymer base material, the precursor is diffused from the top surface of the polymer base material to an inside portion thereof and adsorbed to an adsorption site of the functional group scattered three-dimensionally. Then, the adsorption site becomes a nucleus of the atomic layer deposition film. Since the nucleuses are scattered three-dimensionally, the nucleuses grow in a three-dimensional growth mode until a nucleus contacts an adjacent nucleus to form a continuous film. Therefore, since a period from when the atomic layer deposition film becomes the continuous film to when a dense film with two-dimensional growth is started is long, a dense portion of the atomic layer deposition film due to the two-dimensional growth is reduced. Hence, the gas permeates through the gaps in the atomic layer deposition film. Further, the gas permeates through the space of the free volume. Therefore, sophisticated gas barrier properties of the laminate cannot be obtained.

According to a second representative embodiment of the present invention, in order to try to achieve the following two items, (1) Having the density of the adsorption site be higher,
(2) Avoiding the precursor from diffusing into the polymer base material, an under coat layer containing an organic polymer is disposed on the polymer base material and an adhesive layer having many more adsorption sites is further disposed on the under coat layer. That is, in order to two-dimensionally arrange the adsorption site of the precursor on the top surface of the polymer base material, an under coat layer containing the organic polymer is disposed on the polymer base material before the ALD process and the adhesive layer is further disposed on the top surface of the under coat layer. In order to make the density of the adsorption site higher, inorganic substances may be added to the under coat layer. Thus, the under coat layer containing the organic polymer is disposed on the polymer base material, whereby the gas containing precursor cannot permeate the under coat layer.

(Configuration of Laminate According to the Second Embodiment)

Figure 4:
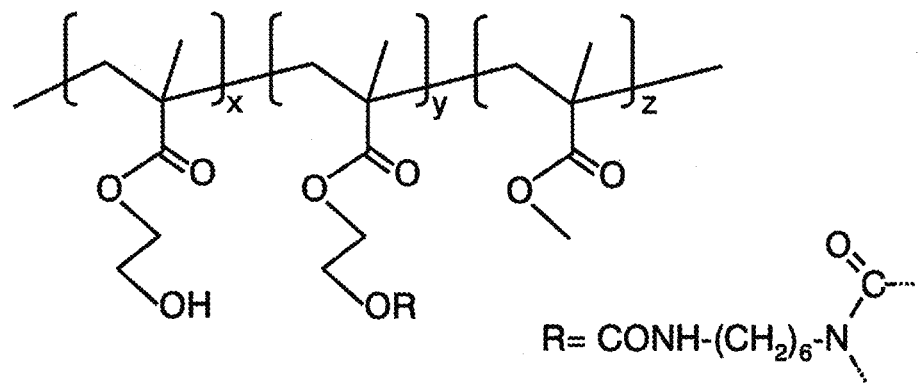
FIG. 4 is a cross sectional view showing a configuration of the laminate according to the second embodiment of the present invention.

First, a configuration of the laminate according to the second embodiment of the present invention is described. FIG. 4 is a cross sectional view showing the laminate 11 according to the second embodiment of the present invention. As shown in FIG. 4, the laminate 11 includes a base material 14 (polymer base material) formed by the polymer, an under coat layer (hereinafter referred to as UC layer) 13 having a membranous shape or a film shape formed on the top surface of the base material 14, an adhesive layer 15 formed on the top surface (exposed surface) of the UC layer 13 and an atomic layer deposition film (hereinafter referred to as ALD film) 12 formed on the top surface of the adhesive layer 15. The UC layer 13 contains an organic polymer material and includes an adsorption site of the precursor of the ALD film 12. Also, the adhesive layer 15 is made of a chemical compound which is almost the same as the UC layer 13. However, in the adhesive layer 15, at least either an element ratio O/C which is a ratio between the oxygen O and the carbon C, or an element ratio N/C which is a ratio between the nitrogen N and the carbon C is higher than that of the UC layer 13 and secures the adsorption site of the ALD film 12 more than the UC layer 13. In other words, a chemical compound that constitutes the adhesive layer 15 includes many functional groups to which the precursor of the ALD film 12 is easily adsorbed. Therefore, the precursor which is a material of the ALD film 12 couples with a functional group containing the O element or the N element contained in the adhesive layer 15, whereby the ALD film 12 is formed in a membranous shape to cover the UC layer 13 via the adhesive layer 15.

(Base Material)

Regarding a base material (polymer base material) 14, the UC layer 13 and the adhesive layer 15 are formed so as to densely produce the ALD film 12. Therefore, a polymer only containing hydrocarbon such as polyethylene (PE), polypropylene (PP) containing the methyl group having less nucleophilicity (refer to FIG. 2A), or polystyrene (PS) may be employed. As a material of the base material 14, polyethylene terephthalate (PET) containing an ester group having nucleophilicity (refer to FIG. 2B), or polymer materials containing O atoms such as polyethylene naphthalate (PEN), N atoms such as nyron and polyimide (PI) or the S atoms such as polyethersulfone may be employed.

The film thickness of the base material 14 is not limited to a specific thickness as long as a thickness can be used for a barrier film. As a film thickness of the base material 14, specifically, for example, a range from 12 µm to 300 µm may preferably be used and a range from 50 µm to 100 µm may more preferably be used.

(UC Layer)

As the UC layer 13, an organic polymer may preferably be used. Alternately, an inorganic substance or a hybrid material including an inorganic substance and an organic substance may be employed. As an organic polymer suitable for the UC layer 13, for example, an organic polymer such as polyvinylalcohol containing the OH group or phenol resin, or polysaccharide group may be employed.

Also, the UC layer 13 preferably contains elements or functional group which contains covalent electron pair. The functional group of the organic polymer contained in the UC layer 13 may preferably contain either O atoms or N atoms. As the functional group containing O atoms, the OH group, the COOH group, the COOR group, COR group, NCO group or $SO_3$ group may be employed. As the functional group containing N atoms, $NH_x$ where X is integer number can be used. The functional group of the organic polymer contained in the UC layer may include, other than the above-described groups, a functional group including atoms having a non-covalent electron pair or an unpaired electron (dangling bond) and coupling to the precursor by a coordinate bond, intermolecular forces (Van der Waals force) or a mutual reaction, e.g., hydrogen bond.

The surface treatment is applied to the top surface of the organic polymer by plasma etching or hydrolyzing and the density of the functional group of the organic polymer is increased, whereby an under coat having the desired density of functional groups can be formed. Specifically, an organic polymer containing aromatic rings such as polyphenylsulfone may preferably be used. For instance, an organic polymer is desirable in which the aromatic ring is opened by plasma etching or the like to produce the OH group or the COOH group.

Figure 5:
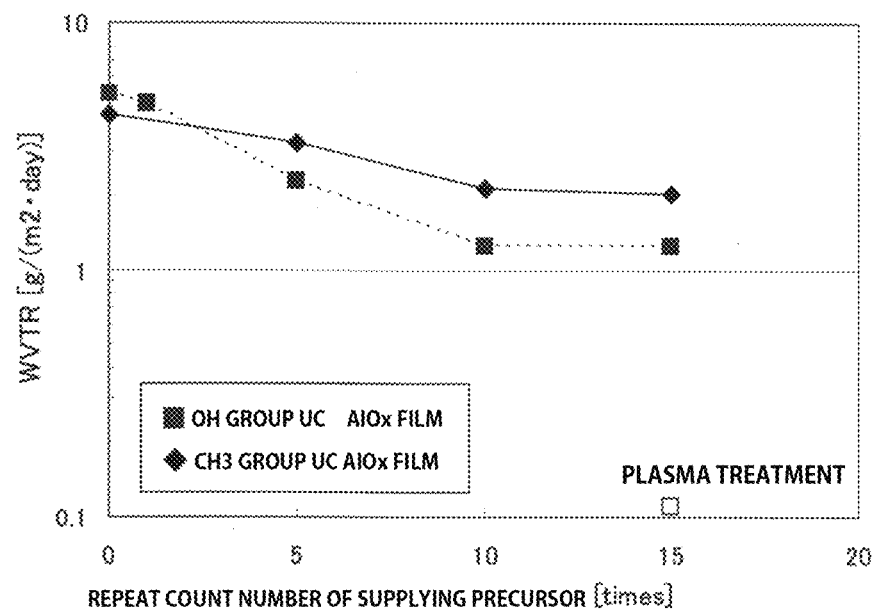
FIG. 5 is a diagram showing a chemical formula of an undercoat layer according to the second embodiment of the present invention.

As the organic polymer containing the OH group, specifically, for example, an epoxy resin or an acrylic resin may preferably be used. Among these, more preferably, a copolymer (refer to FIG. 5) of poly (methacrylic acid-2-hydroxyethyl) and polymethyl methacrylate may be used. Moreover, it is preferable that the copolymer contains poly (methacrylic acid-2-hydroxyethyl) with a ratio of 15% mol to 50% mol. This is because the amount of the adsorption site is sufficient and the coating can be performed with various solvents.

Regarding the polysaccharide, specifically, cellulose derivatives such as cellulose, hydroxymethyl polysaccharide and carboxymethyl cellulose, chitin and chitosan may be used.

As the UC layer 13, for example, an organic polymer having the COOH group which is a functional group having nucleophilicity, an ester bond, N atoms or S atoms may be employed. Moreover, as the UC layer 13, a copolymer of an organic polymer and other organic polymer or a hybrid material of an organic polymer and an inorganic substance may be employed.

The film thickness of the UC layer 13 is not limited to any specific film thickness, however, the film thickness may preferably be in a range from 100 nm to 100 µm. It is not preferable to use an UC layer 13 having a film thickness less than 100 nm, since a portion where the UC layer cannot be formed due to an unevenness of a coating may appear. Meanwhile, it is not preferable to use the UC layer 13 having the film thickness exceeding 100 µm, since the base material is deformed due to a contraction of the UC layer 13. In contrast, when the film thickness of the UC layer 13 is within the above-described range, the UC layer can be coated uniformly so that an influence of the contraction can be reduced. Therefore, it is preferable to use an UC layer 13 having the film thickness within the above-described range.

(Organic Polymer Used for UC Layer)

Hereinafter will be described the organic polymer used for the UC layer 13. The organic polymer is categorized into a water base and a solvent base depending on the solvent to be used. As the water base organic polymer, polyvinylalcohol, polyethylene imine and the like can be used. Also, as the solvent base organic polymer, acrylic ester, polyester acryl and polyether acryl can be used.

Hereinafter will be described a further detailed specific example of the organic polymer of a resin containing O atoms.

1. Organic Polymer of Resin Containing O Atoms

The preferable materials for the organic polymer of the resin containing O atoms include polyvinylalcohol which is a resin containing the hydroxyl group (OH), a phenol resin and a polysaccharide. The polysaccharide includes cellulose derivatives such as cellulose, hydroxymenthyl cellulose, hydroxyethyl cellulose, carboxymethyl cellulose, chitin, chitosan or the like. The preferable materials for the organic polymer of the resin containing O atoms is carboxyvinyl polymer which is a resin containing the carbonyl group (COOH).

Other than that, the organic polymer containing O atoms may include polyketone which is a resin containing the ketone group (CO), polyether ketone, polyether ether ketone, aliphatic polyketone or the like. Also, as other organic polymers containing O atoms, polyether resin which is a resin containing the ester group (COO), polycarbonate resin, liquid crystal polymer, polyethylene terephthalate (PET), polybutylene terephthalate (PBT), polyethylene naphthalate (PEN), polybutylene naphthalate (PBN) and polytrimethylene terephthalate (PTT) can be used. Other than that, an epoxy resin containing the above-described functional groups or an acrylic resin or the like may be used.

2. Organic Polymer Containing N Atoms

The preferable materials for the organic polymer of the resin containing the N atoms include polyimide which is a resin containing the imide group (CONHCO), polyether imide, alicyclic polyimide, solvent-soluble polyimide or the like. As for the alicyclic polyimide, normally, the aromatic polyimide that constitutes the alicyclic polyimide is obtained from an aromatic tetracarboxylic acid dianhydride and an aromatic diamine. However, the alicyclic polyimide obtained from these materials does not have transparency. Therefore, in order to obtain transparency of the polyimide, the acid dianhydride and the diamine among these materials can be substituted by an alicyclic material or an aliphatic material respectively. As the alicyclic carboxylic acid, 1,2,4,5-cyclohexane tetracarboxylic acid and 1,2,4,5-cyclopentane tetracarboxylic acid dianhydride can be used. Further, as the solvent-soluble polyimide, γ-butyrolactone, N,N-dimethylacetamide and N-methyl-2-pyrrolidone can be used.

3. Organic Polymer of Resin Containing S Atoms

The materials capable of being used for the organic polymer include sulphonyl group ($SO_2$), polyethersulfone (PES), polysulfone (PSF) and polyphenylsulfone (PPS). Among these, the PES and the PSF have high heat resistance properties. Also, polymer alloy, polybutylene terephthalate based polymer alloy and polyphenylene sulfide based polymer alloy or the like can be used as the above-described organic polymer. The above-described polymer may be combined to be a polymer alloy (alloy blended composite) as needed.

It is desirable to use the laminate according to the embodiment of the present invention since advantages obtained by the adhesive layer 15 are significant when using an organic polymer of a resin containing O atoms for the UC layer 13.

(Inorganic Substances Applied to UC Layer)

As described above, when inorganic substances (inorganic compound) are applied to the UC layer 13, an adsorption density of the precursor of the ALD film is further improved. The inorganic substances applied to the UC layer 13 will now be described in detail. As the inorganic substances applied to the UC layer 13, a metal alkoxide (precursor of an inorganic compound) is used. The metal alkoxide is expressed, as a general formula, by R1 (M-OR2), where R1, R2 represents a 1-8C organic group and M represents a metal atom. The metal atom M includes Si, Ti, Al and Zr or the like.

When the metal atom M is Si, as a material expressed by R1 (Si—OR2), tetramethoxysilane, tetraethoxysilane, tetrapropoxysilane, tetrabutoxysilane, methyl trimethoxysilane, dimethyl dimethoxysilane and dimethyl diethoxysilane are employed.

When the metal atom M is Zr, as a material expressed R1 (Zr—OR2), tetramethoxy zirconium, tetraethoxy zirconium, tetraisopropoxy zirconium and tetrabutyloxy zirconium are employed.

When the metal atom M is Ti, as a material expressed R1 (Ti—OR2), tetramethoxy titanium, tetraethoxy titanium, tetraisopropoxy titanium and tetrabutyloxy titanium are employed.

When the metal atom M is Al, as a material expressed R1 (Al—OR2), tetramethoxy alminum, tetraethoxy alminum, tetraisopropoxy alminum and tetrabutyloxy alminum are employed.

(Adhesive Layer)

As shown in FIG. 4, the adhesive layer 15 is constituted by an organic polymer disposed on the top surface of the UC layer 13 (i.e., between the UC layer 13 and the ALD film 12). In the adhesive layer 15, the functional group (functional group having nucleophilicity such as the OH group and the COOH group) of the organic polymer contained in the UC layer 13 has a density higher than in the UC layer 13. The adhesive layer 15 is provided to enhance the density where the precursor that is a material of the ALD film 12 is cross-linked with the functional group.

Specifically, the adhesive layer 15 is a top layer part in which at least either an element ratio O/C between the oxygen element O and the carbon element C in the film or an element ratio N/C between the nitrogen element N and the carbon element C in the film is larger than inside the UC layer 13.

The peak intensity is measured by using X-ray photoelectron spectroscopy (e.g., manufactured by JEOL Ltd) to obtain the ratio of peak height, thereby acquiring the element ratio of the adhesive layer 15 and the UC layer 13. In other words, the boundary surface between the adhesive layer 15 and the UC layer 13 can be discerned by the element ratio of the adhesive layer 15 and the UC layer 13.

Specifically, when using the element ratio O/C, the adhesive layer 15 may preferably be a region where the element ratio O/C is in a range from the 0.45 to 0.85 towards the thickness direction from the top layer part of the adhesive layer 15. Also, when acquiring the element ratio O/C from the bottom surface towards the top layer part of the UC layer 13 in the thickness direction, a region in which the element ratio O/C increases for 0.1 or more with respect to the bottom surface of the UC layer 13 may preferably be the boundary surface between the adhesive layer 15 and the UC layer 13.

Meanwhile, when using the element ratio N/C, the adhesive layer 15 may preferably be defined as a region having element ratio N/C in a range from 0.01 to 0.20, located towards the thickness direction from the top layer part of the adhesive layer 15. Also, when acquiring the element ratio N/C from the bottom surface towards the top layer part of the UC layer 13 in the thickness direction, a region in which the element ratio N/C increases by 0.02 or more may preferably be the boundary surface between the adhesive layer 15 and the UC layer 13.

In the laminate 11 after manufacturing, a method for recognizing the boundary surface between the adhesive layer 15 and the UC layer 13 is not limited to a specific method. Specifically, for example, polishing or etching is applied from the ALD film 12 side or the base material (polymer material) 14 side to shave the top surface and expose the adhesive layer 15, thereby recognizing the adhesive layer 15 and the boundary surface.

Further, the film thickness of the adhesive layer 15 is not specifically limited. However, the film thickness of the adhesive layer 15 may preferably be in a range from 0.1 nm to 100 nm and more preferably, 0.3 nm to 30 nm, and furthermore, preferably 0.5 nm to 10 nm. When the film thickness of the adhesive layer 15 is less than 0.1 nm, the adhesive layer does not serve as an adhesive layer since nucleophilic functional groups exist with less than one atom layer, which is not desirable. Meanwhile, it is not desirable to have the film thickness exceeding 100 nm, since a long processing period causes depolymerization of the organic polymer at the top layer of the UC layer 13 so that the durability is lowered. In contrast, it is preferable to have the film thickness of the adhesive layer within the above-described range, since sufficient nucleophilic functional groups exist, having enough durability.

(ALD Film)

As the ALD film 12, specifically, for example, an inorganic oxide film made of such as $AlO_x$, $TiO_x$, $SiO_x$, $ZnO_x$ and $SnO_x$, a nitride film and an oxynitride film constituted by these inorganic substances, an oxide film, a nitride film and oxynitride film constituted by elements other than that of these matters may be used. Among these, a matter containing Al, Si or Ti in the ALD film 12 is desirable. Moreover, the ALD film 12 may be a mixed film made of the above-described films or elements.

The film thickness of the ALD film 12 is not limited to a specific thickness, however, the thickness may preferably range from 2 nm to 50 nm. Here, it is not preferable to use an ALD film 12 with film thickness of less than 2 nm, since the WVTR is approximately $10^{-1}$ so that the target barrier properties of $10^{-3}$ or less cannot be achieved. Meanwhile, it is not preferable to use the film thickness exceeding 50 nm, since more cost and time are necessary. Therefore, it is preferable to use an ALD film 12 having film thickness within the above-described range, since only short period of time is required and sufficient water vapor barrier properties are obtained.

(Manufacturing Method of Laminate According to Second Embodiment)

Hereinafter will be described a manufacturing method of the laminate 11 according to the second embodiment of the present invention. As the manufacturing method of the laminate 11 according to the embodiment of the present invention, an atomic layer deposition film is laminated on the polymer film by the atomic layer deposition method. Specifically, the base material 14 constituted by a polymer material is disposed in the vacuum chamber of the ALD apparatus (first process). Next, the UC layer 13 containing an organic polymer and having a membranous shape or a film shape is formed on at least a part of the outer surface of the base material 14 (second process). Next, a surface treatment is applied to at least a part of the surface (exposed surface of UC layer 13) opposite to a surface contacted to the base material 14, in the UC layer 13 formed at the second process in the thickness direction thereof. Then, a functional group having nucleophilicity is implemented to the UC layer 13 so as to form the adhesive layer 15 (third process). Subsequently, a precursor material is supplied to a top surface of the adhesive layer 15 (fourth process) such that the precursor which is the material of the atomic layer deposition film is coupled to the functional group of the organic polymer contained in the UC layer 13 or the functional group having nucleophilicity of the adhesive layer 15. Next, excess precursor material which is not coupled in the fourth process is removed and a coupling amount of precursor coupled to the functional group of the organic polymer contained in the UC layer 13 and the functional group having nucleophilicity of the adhesive layer 15 are saturated, thereby forming the ALD film 12 (fifth process).

In the second process, a method for forming the UC layer 13 is not limited, however, appropriate coating techniques such as spin coating, roll coating or bar coater can be employed.

In the third process, as a method for the surface treatment of a part of the UC layer 3, plasma processing (plasma etching), a corona treatment and alkali processing can be employed. Thus, the adhesive layer 15 containing the functional group having nucleophilicity such as the OH group and the COOH group is produced on the top surface of the UC layer 3. As a result, the density where the precursor is coupled to the functional group of the adhesive layer 15 or the UC layer 13 to be cross-linked becomes high. The precursor is the material of the ALD film 12 being formed in the fourth process and the fifth process. Accordingly, the adhesive layer 15 in which the functional group of the organic polymer contained in the UC layer 13 is densified, is produced between the UC layer 13 and the ALD film 12, whereby the gas barrier properties of the laminate 11 can be further enhanced.

In the fourth process and the fifth process, as a method for forming the ALD film 12, the atomic layer deposition method (ALD method) is used. The precursor material (material gas) is supplied and a purge gas is supplied in order to remove excess precursor material. By only supplying the precursor material once and removing it, the precursor may not be coupled with some of the functional groups having nucleophilicity such as the OH group or the COOH group which are capable of being reacted with the precursor. Therefore, the step of supplying the precursor material and the step of evacuating excess precursor material to remove it are repeatedly performed so as to saturate the amount of the precursor coupled with the functional group having nucleophilicity of the organic polymer, thereby forming the ALD film 12. The number of supply and evacuation of the precursor material may preferably be in a range from one to thirty times.

As described above, according to the manufacturing method of the laminate 11 of the embodiment of the present invention, after implementing the UC layer 13 on the polymer base material 14, the adhesive layer 15 is disposed at the top layer of the UC layer 13 by online-plasma pre-processing before forming the ALD film 12 (i.e., continuously performing the third process and the fourth process after the second process). Accordingly, the functional group having high reactivity of the adhesive layer 15 may not react with substances in the atmosphere, and thereby not cause deactivation or may not cause contamination of the top surface of the adhesive layer 15. Thus, the gas barrier properties of the laminate 11 can be further enhanced.

(Gas Barrier Film According to the Second Embodiment and the Manufacturing Method Thereof)

The gas barrier film according to the embodiment of the present invention includes the laminate 11 formed in a film shape of the above-described aspect. Hence, as similar to the above-described laminate 11, a precise film structure having high gas barrier properties can be obtained.

The manufacturing method of the gas barrier film according to the embodiment forms the laminate 11 manufactured by the manufacturing method of the above-described laminate 11 to be in a film shape.

As described, the laminate 11 according to the present embodiment has a structure in which the adhesive layer 15 having densified functional groups such as C—OH groups or COOH groups is disposed on the top layer of the UC layer 13. As a result, the density where the precursor of the ALD film is coupled to the functional group of the adhesive layer 15 to be cross-linked becomes high. The gas barrier properties of the laminate 11 are further enhanced. In other words, the adhesive layer 15 in which the functional group is densified between the ALD film 12 and the UC layer 13 is provided, whereby the density of the adsorption site capable of coupling with the precursor of the ALD film is enhanced. Therefore, according to the laminate 11 of the present embodiment, the ALD film grows two-dimensionally so that a precise film structure having high gas barrier properties can be obtained.

In the laminate 11 according to the present embodiment, the precursor which is the material of the ALD film 12 can be arranged in the adsorption site of the adhesive layer 15 with high density. Hence atomic layer growth which is close to two-dimensional growth can be accomplished. Moreover, the ALD film 12 two-dimensionally grown becomes a film in which atoms are coupled densely in the surface direction. Accordingly, since gaps where the gas permeates in the thickness direction are few, the gas barrier properties can be enhanced. As a result, it is formed in the film shape, being used as a gas barrier film.

EXAMPLES

First Example

Hereinafter will be described a specific example of the laminate according to the first embodiment.

(Formation of Under Coat Layer)

A coating liquid was applied on a plane surface of the base material having one surface which is an easy adhesion treatment surface and the other surface which is an untreated surface (referred to as the plane surface), by using a wire bar to form the UC layer having a film thickness 0.34 μm after drying. The base material is formed by either a thickness 100 μm of polyethylene terephthalate (PET) film ("A-4100" manufactured by Toyobo Co. Ltd) or a thickness 70 μm of polypropylene (PP) film (Mitsui Chemicals Tohcello, Inc.).

As a manufacturing method for forming the coating liquid, specifically, first, an organic polymer made of a copolymer of poly (methacrylic-2-hydroxyethyl) and polymethyl methacrylate, containing 35% moles poly (methacrylic-2-hydroxyethyl) in the copolymer was dissolved in a mixed solution containing methyl ethyl ketone and cyclohexanone. Next, Sumidur N3300 (Sumika Bayer Urethane Co., Ltd) was added to the mixed solution so as to produce the coating liquid.

Subsequently, the coating liquid was coated onto the base material by using a wire bar and dried at 90 degrees C. for one minute.

Figure 6:
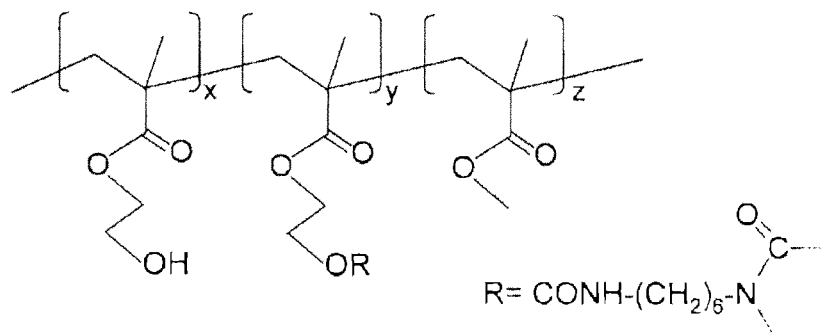
FIG. 6 is a diagram showing a chemical formula of an undercoat layer 3 according to the example of the present invention.

Then, the base material with the coating liquid coated thereon was heated at 60 degrees C. for 48 hours. Thus, the NCO groups in the isocyanate curing agent N3300 and at least some of the OH groups in the poly (methacrylic-2-hydroxyethyl) were reacted so as to form the UC layer on the base material, having a chemical formula as shown in FIG. 6.

(Formation of Atomic Layer Deposition Film)

$Al_2O_2$ film was formed on the upper surface of the UC layer by the atomic layer deposition method (ALD method). In this case, the material gas was trimethyl aluminum (TMA). Also, the material gas was supplied simultaneously with $N_2$ and $O_2$ as purge gas.

Further, a manufacturing step of supplying the material gas into the film-forming chamber and a step of exhausting excess precursor to be removed were repeatedly performed.

Subsequently, $O_2$ as a reactant gas and a discharge gas was supplied into the film-forming chamber. The processing pressure was 10 to 50 Pa. Regarding the power source for excitation of the plasma gas, a power source of frequency 13.56 MHz was used and a plasma discharging was performed in the ICP (Inductively Coupled Plasma) mode.

The supply periods for the respective gasses were: 60 milliseconds for the TMA and the process gas, 10 seconds for the purge gas, and 10 seconds for the reactant gas and the discharge gas. Then, the reactant gas and the discharge gas were supplied to the film-forming chamber and at the same time, a plasma discharge was produced in the ICP mode. The output power of the plasma discharge was 250 watts. Moreover, as a gas purge after the plasma discharge, the purge gas $O_2$ and $N_2$ were supplied to the film-forming chamber for ten seconds. In this case, the film-forming temperature was 90 degrees C.

The film-forming rate of $Al_2O_3$ in the above-described cycle condition was as follows. That is, since the film-forming rate per unit is 1.4 to 1.5 Å/cycle, the film-forming process was performed for 15 cycles to form a film-thickness 2 nm of the film. The total time for the film-forming was one hour. In order to study an influence on the ALD layer by the UC layer having the organic polymer containing the OH group, the film-thickness of the ALD film was set to be 2 nm. The film thickness of the ALD film was set to be 2 nm, whereby an initial growth of the ALD layer being significantly influenced by the UC layer was readily observed.

(Moisture Vapor Transmission Rate of Laminate)

Figure 7:
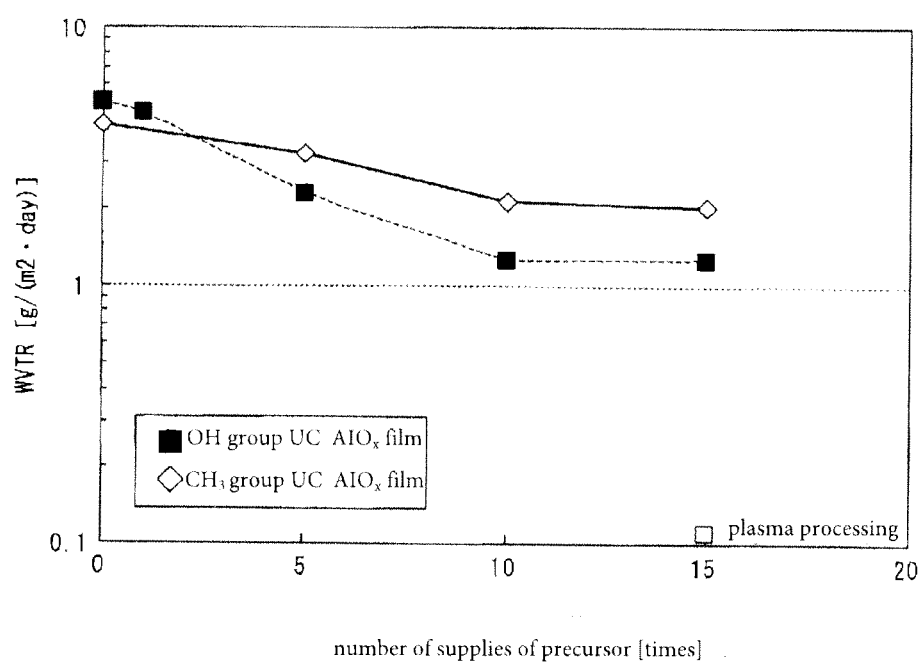
FIG. 7 is a graph showing a comparison where a moisture vapor transmission rate is compared between a laminate having an UC layer containing the OH group according to the present example and a laminate having an UC layer containing the $CH_3$ group.

As for the gas barrier properties of the laminate, the moisture vapor transmission rate was measured by a moisture vapor transmission rate equipment (Mocon Permatran (registered trade mark) manufactured by Mocon Inc.) in an atmosphere of 40 degrees C./90% RH. FIG. 7 is a graph where the moisture vapor transmission rates are compared between the laminates according to the present embodiment and the comparative Examples.

Example 1

In the Example 1, a 2 nm thickness of $Al_2O_3$ film was formed on the UC layer on the PET film base material by the ALD method. The number of supplies and exhausts of the precursor was 1. The moisture vapor transmission rate (WVTR) was measured for the sample of the laminate produced in this manner. The measurement value of the WVTRT at this time was 4.65 [$g/m^2/day$].

Example 2

In the Example 2, a 2 nm thickness of $Al_2O_3$ film was formed on the UC layer on the PET film base material by the ALD method. The number of supplies and exhausts of the precursor was 5. The WVTR was measured for the sample of the laminate produced in this manner. The measurement value of the WVTRT at this time was 2.27 [$g/m^2/day$].

Example 3

In the Example 3, a 2 nm thickness of $Al_2O_3$ film was formed on the UC layer on the PET film base material by the ALD method. The number of supplies and exhausts of the precursor was 10. The WVTR was measured for the sample of the laminate produced in this manner. The measurement value of the WVTRT at this time was 1.25 [$g/m^2/day$].

Example 4

In the Example 4, a 2 nm thickness of $Al_2O_3$ film was formed on the UC layer on the PET film base material by the ALD method. The number of supplies and exhausts of the precursor was 15. The WVTR was measured for the sample of the laminate produced in this manner. The measurement value of the WVTRT at this time was 1.24 [$g/m^2/day$].

Example 5

In the Example 5, before forming the $Al_2O_3$ film on the UC layer on the PET film base material, the plasma discharge was produced by the ICP mode. The output power of the plasma discharge was 250 watts. Moreover, as a gas purge after the plasma discharging, the purge gas $O_2$ and $N_2$ were supplied to the film-forming chamber for ten seconds.

When observing a state of the top surface by X-ray photoelectron spectroscopy (e.g., manufactured by JEOL Ltd), peaks of the COOH groups and OH groups were observed and an amount of the OH groups on the top surface was increased. Moreover, when the water contact angle of the top surface was observed by the water contact angle meter (manufactured by KRUSS), it was 86 degrees before the plasma processing was performed, however, it was 43 degrees after the plasma processing was performed. According to these results, it was found that the OH group on the top surface was densified by the plasma processing.

After that, a 2 nm thickness of $Al_2O_3$ film was formed on the UC layer which was surface treated, by the ALD method. The number of supplies and exhausts of the precursor was 15. The WVTR was measured for the sample of the laminate produced in this manner. The measurement value of the WVTRT at this time was 0.11 [g/m²/day].

Example 6

In the Example 6, a 2 nm thickness of $Al_2O_3$ film was formed on the UC layer on the PP film base material by the ALD method. The number of supplies and exhausts of the precursor was 5. The WVTR was measured for the sample of the laminate produced in this manner. The measurement value of the WVTRT at this time was 2.18 [g/m²/day].

Example 7

In the Example 7, a 2 nm thickness of $Al_2O_3$ film was formed on the UC layer on the PP film base material by the ALD method. The number of supplies and exhausts of the precursor was 10. The WVTR was measured for the sample of the laminate produced in this manner. The measurement value of the WVTRT at this time was 1.29 [g/m²/day].

Example 8

In the Example 8, a 2 nm thickness of $Al_2O_3$ film was formed on the UC layer on the PP film base material by the ALD method. The number of supplies and exhausts of the precursor was 15. The WVTR was measured for the sample of the laminate produced in this manner. The measurement value of the WVTRT at this time was 1.27 [g/m²/day].

Example 9

In the Example 9, a 20 nm thickness of $Al_2O_3$ film was formed on the UC layer on the PET film base material by the ALD method. The number of supplies and exhausts of the precursor was 1. The WVTR was measured for the sample of the laminate produced in this manner. The measurement value of the WVTRT at this time was $1.0 \times 10^{-3}$ [g/m²/day].

Hereinafter will be described the comparative examples.

Comparative Example 1

In the Comparative Example 1, polypropylene (PP) film (manufactured by Mitsui Chemicals Tohcello, Inc., film thickness 70 um) was regarded as the base material and the UC layer and employed as an example of the UC layer having no OH group. Then, the WVTR was measured without forming the $Al_2O_3$ film on the base material. The measurement value of the WVTR at this time was 4.84 [g/m²/day].

Comparative Example 2

In the Comparative Example 2, similar to the Comparative Example 1, the PP film was regarded as the base material and the UC layer and was employed as the UC layer having no OH group. Then, an $Al_2O_3$ film with thickness of 2 nm was formed on the plane surface side of the base material by the ALD method. The number of supplies and exhausts of the precursor was 5. The WVTR was measured for the sample of the laminate produced in this manner. The measurement value of the WVTRT at this time was 3.24 [g/m²/day].

Comparative Example 3

In the Comparative Example 3, similar to the Comparative Example 1, the PP film was regarded as the base material and the UC layer and was employed as the UC layer having no OH group. Then, an $Al_2O_3$ film with thickness of 2 nm was formed on the plane surface side of the base material by the ALD method. The number of supplies and exhausts of the precursor was 10. The WVTR was measured for the sample of the laminate produced in this manner. The measurement value of the WVTRT at this time was 2.12 [g/m²/day].

Comparative Example 4

In the Comparative Example 4, similar to the Comparative Example 1, the PP film was regarded as the base material and the UC layer and was employed as the UC layer having no OH group. Then, an $Al_2O_3$ film with thickness of 2 nm was formed on the plane surface side of the base material by the ALD method. The number of supplies and exhausts of the precursor was 15. The WVTR was measured for the sample of the laminate produced in this manner. The measurement value of the WVTRT at this time was 2.02 [g/m²/day].

Comparative Example 5

In the Comparative Example 5, similar to the Comparative Example 1, the PP film was regarded as the base material and the UC layer and was employed as the UC layer having no OH group. Then, an $Al_2O_3$ film with thickness of 20 nm was formed on the plane surface side of the base material by the ALD method. The number of supplies and exhausts of the precursor was 1. The WVTR was measured for the sample of the laminate produced in this manner. The measurement value of the WVTRT at this time was 0.30 [g/m²/day].

The Table 1 summarizes the contents of the Examples 1 to 8 and the Comparative Examples 2 to 4 where an $Al_2O_3$ film with thickness of 2 nm was formed and the contents of the Comparative Example 1 where the $Al_2O_3$ film was not formed. The Table 2 summarizes the contents of Example 9 and Comparative Example 5 where an $Al_2O_3$ film with thickness of 20 nm was formed.

TABLE 1

| | Base material | UC layer | The number of supplies/ exhausts of precursor | Plasma processing | WVTR [g/m²/day] |
|---|---|---|---|---|---|
| Example 1 | PET 100 μm | OH group | 1 | None | 4.65 |
| Example 2 | PET 100 μm | OH group | 5 | None | 2.27 |
| Example 3 | PET 100 μm | OH group | 10 | None | 1.25 |
| Example 4 | PET 100 μm | OH group | 15 | None | 1.24 |
| Example 5 | PET 100 μm | OH group | 15 | Plasma processing before ALD film-forming | 0.11 |
| Example 6 | PP 70 μm | OH group | 5 | None | 2.18 |
| Example 7 | PP 70 μm | OH group | 10 | None | 1.29 |
| Example 8 | PP 70 μm | OH group | 15 | None | 1.27 |
| Comparative Example 1 | PP 70 μm | $CH_3$ group | 0 | None | 4.24 |
| Comparative Example 2 | PP 70 μm | $CH_3$ group | 5 | None | 3.24 |

TABLE 1-continued

| | Base material | UC layer | The number of supplies/ exhausts of precursor | Plasma processing | WVTR [g/m²/day] |
|---|---|---|---|---|---|
| Comparative Example 3 | PP 70 μm | CH₃ group | 10 | None | 2.12 |
| Comparative Example 4 | PP 70 μm | CH₃ group | 15 | None | 2.02 |

TABLE 2

| | Base material | UC layer | The number of supplies/ exhausts of precursor | Plasma processing | WVTR [g/m²/day] |
|---|---|---|---|---|---|
| Example 9 | PET 100 μm | OH group | 1 | None | $1.0 \times 10^{-3}$ |
| Comparative Example 5 | PP 70 μm | CH₃ group | 1 | None | 0.3 |

As described, it was found that the laminate provided with the UC layer having the organic polymer containing the OH group had a lower WVTR value and gave a better vapor-shielding effect, compared to the laminate provided with the UC layer containing no OH group.

Second Example

Hereinafter will be described specific examples of the laminate according the above-described second embodiment.
(Formation of Under Coat Layer)

A coating liquid was applied on a plane surface of the base material having one surface which is an easy adhesion treatment surface and the other surface which is an untreated surface (referred to as the plane surface), by using a wire bar to form the UC layer having a film thickness 0.34 μm after drying. The base material is formed by a thickness 100 μm of polyethylene terephthalate (PET) film ("A-4100" manufactured by Toyobo Co. Ltd).

As a manufacturing method for forming the coating liquid, specifically, first, an organic polymer made of a copolymer of the poly (methacrylic-2-hydroxyethyl) and polymethyl methacrylate, containing 35% moles poly (methacrylic-2-hydroxyethyl) in the copolymer was dissolved in a mixed solution containing methyl ethyl ketone and cyclohexanone. Subsequently, the coating liquid was produced.

Subsequently, the coating liquid was coated onto the base material by using the wire bar and dried at 90 degrees C. for one minute so as to form the UC layer on the base material.
(Formation of Adhesive Layer)

As the reactant gas and the discharge gas, either $O_2$ or $N_2$ was supplied into the film-forming chamber. The processing pressure was 10 to 50 Pa. Regarding the power source for excitation of the plasma gas, a power source of frequency 13.56 MHz was used and plasma discharging was performed for 60 seconds in the ICP (Inductively Coupled Plasma) mode. The output power of the plasma discharge was 250 watts. Moreover, as a gas purging after the plasma discharging, the purge gas $O_2$ and $N_2$ were supplied to the film-forming chamber for ten seconds. In this case, the reaction temperature was 90 degrees C.

Regarding the element ratio of the adhesive layer and the UC layer, the peak intensities of C1s and O1s were measured by using X-ray photoelectron spectroscopy (e.g., manufactured by JEOL Ltd). As an X-ray source, the Mg K line was used where the retention period was 100 milliseconds and the cumulative number of applications was 5 times. The following Table 3 represents a comparison of the O/C peak height ratio between the laminate of the present embodiment and the laminate of the present embodiment

TABLE 3

| | Plasma processing | Element ratio (O/C)* | Element ratio (N/C)* |
|---|---|---|---|
| Example 10 | O₂ plasma 60 seconds | 0.68 | 0.00 |
| Example 11 | O₂ plasma 120 seconds | 0.72 | 0.00 |
| Example 12 | N₂ plasma 60 seconds | 0.40 | 0.03 |
| Comparative Example 6 | None | 0.40 | 0.00 |

*X-ray photoelectron spectroscopy was used (Formation of Atomic Layer Deposition Film)

$Al_2O_3$ film was formed on the top layer of the adhesive layer by the atomic layer deposition method (ALD method). In this case, tri-methyl aluminum (TMA) was used as the material gas. Also, the material gas was supplied simultaneously with $N_2$ and $O_2$ as purge gas.

Further, a manufacturing step of supplying the material gas into the film-forming chamber and a step of exhausting excess precursor to be removed were repeatedly performed.

Subsequently, $O_2$ as a reactant gas and a discharge gas was supplied into the film-forming chamber. The processing pressure was 10 to 50 Pa. Regarding the power source for excitation of the plasma gas, a power source of frequency 13.56 MHz was used and a plasma discharge was performed in the ICP (Inductively Coupled Plasma) mode.

The supplying periods for the respective gasses were: 60 milliseconds for the TMA and the process gas, 10 seconds for the purge gas, and 10 seconds for the reactant gas and the discharge gas. Then, the reactant gas and the discharge gas were supplied to the film-forming chamber and at the same time, a plasma discharge was produced by the ICP mode. The output power of the plasma discharge was 250 watts. Moreover, as a gas purge after the plasma discharging, the purge gas $O_2$ and $N_2$ were supplied to the film-forming chamber for 10 seconds. In this case, the film-formation temperature was 90 degrees C.

The film-forming rate of $Al_2O_3$ in the above-described cycle condition was as follows. That is, since the film-forming rate per unit is 1.4 to 1.5 Å/cycle, the film-forming process was performed for 15 cycles to form a film having a thickness of 2 nm. The total time for the film formation was one hour. In order to study an influence on the ALD layer from the adhesive layer that contains the functional group having nucleophilicity, the thickness of the ALD film was set to be 2 nm. The film thickness of the ALD film was set to be 2 nm, whereby initial growth of the ALD layer being significantly influenced by the UC layer was readily observed.
(Moisture Vapor Transmission Rate of Laminate)

As for the gar barrier properties of the laminate, the moisture vapor transmission rate was measured by moisture vapor transmission rate equipment (Mocon Permatran (registered trade mark) manufactured by Mocon Inc.) in an atmosphere at 40 degrees C./90% RH. The table 4 as shown in the following shows the moisture vapor transmission rates compared between the laminate according to the present embodiment and the comparative examples.

|  | Plasma processing | The number of supplies/ exhausts of precursor | WVTR [g/m²/day] |
|---|---|---|---|
| Example 10 | O₂ plasma 60 seconds | 15 | 0.09 |
| Example 11 | O₂ plasma 120 seconds | 15 | 0.20 |
| Example 12 | N₂ plasma 60 seconds | 15 | 0.70 |
| Comparative example 6 | None | 15 | 1.20 |

Example 10

In the Example 10, the plasma processing was performed for 60 seconds, supplying $O_2$ onto the UC layer so as to produce the adhesive layer. At this point, the element ratio of the top layer of the adhesive layer was measured by X-ray photoelectron spectroscopy. The element ratio of O and C in the adhesive layer was O/C=0.68.

Subsequently, an $Al_2O_3$ film of thickness 2 nm was formed on the adhesive layer by the ALD method. The number of supplies and exhausts of the precursor was 15. The moisture vapor transmission rate (WVTR) was measured for the sample of the laminate produced in this manner. The measurement value of the WVTRT at this time was 0.09 [g/m²/day].

Example 11

In the Example 11, the plasma processing was performed for 120 seconds, supplying $O_2$ onto the UC layer so as to produce the adhesive layer. At this point, the element ratio of the top layer of the adhesive layer was measured by X-ray photoelectron spectroscopy. The element ratio of O and C in the adhesive layer was O/C=0.72.

Subsequently, an $Al_2O_3$ film of thickness 2 nm was formed on the adhesive layer by the ALD method. The number of supplies and exhausts of the precursor was 15. The moisture vapor transmission rate (WVTR) was measured for the sample of the laminate produced in this manner. The measurement value of the WVTRT at this time was 0.20 [g/m²/day].

Example 12

In the Example 12, the plasma processing was performed for 60 seconds, supplying $O_2$ onto the UC layer so as to produce the adhesive layer. At this point, the element ratio of the top layer of the adhesive layer was measured by X-ray photoelectron spectroscopy. The element ratio of N and C in the adhesive layer was N/C=0.03.

Subsequently, an $Al_2O_3$ film of thickness 2 nm was formed on the adhesive layer by the ALD method. The number of supplies and exhausts of the precursor was 15. The moisture vapor transmission rate (WVTR) was measured for the sample of the laminate produced in this manner. The measurement value of the WVTRT at this time was 0.70 [g/m²/day].

Comparative Example 6

In the Comparative Example 6, the surface treatment was not performed on the UC layer. At this point, the element ratio of the top layer of the adhesive layer was measured by X-ray photoelectron spectroscopy. The element ratio of O and C in the UC layer was O/C=0.40.

Subsequently, 2 nm thickness of $Al_2O_3$ film was formed on the adhesive layer by the ALD method. The number of supplies and exhausts of the precursor was 15. The moisture vapor transmission rate (WVTR) was measured for the sample of the laminate produced in this manner. The measurement value of the WVTRT at this time was 1.20 [g/m²/day].

As described, it was found that the laminate provided with the adhesive layer according to the examples 10 to 12 had a lower WVTR value and had a better vapor-shielding effects, compared to the laminate according to the comparative example 6 where the adhesive layer is not provided.

In the above-description, the effects of the present invention were explained with examples and comparative examples. The present invention is not limited to the above-described examples.

INDUSTRIAL APPLICABILITY

The laminate according to the present invention can be utilized for electronic components such as electro luminescence elements (EL element) and liquid crystal displays, also, can be utilized effectively for packaging films of medicines, foods and etc.

REFERENCE SIGNS LIST

1, 11: laminate
2, 12: atomic layer deposition film (ALD film)
3, 13: under coat layer (UC layer)
4, 14: polymer base material (base material)
15: adhesive layer

What is claimed is:
1. A laminate comprising:
a base material having a top surface;
an under coat layer formed on at least a part of the top surface of the base material, having a membranous shape or a film shape and containing an organic polymer having an OH group; and
an atomic layer deposition film formed in a membranous shape to cover an exposed surface of the under coat layer, the atomic layer deposition film being formed by a precursor as a material thereof, wherein
at least a part of the precursor is coupled to the OH group of the organic polymer.
2. The laminate of claim 1,
wherein the organic polymer is a copolymer of poly (methacrylic acid-2-hydroxyethyl) and polymethylmethacrylate.
3. The laminate of claim 2,
wherein the poly (methacrylic acid-2-hydroxyethyl) of the copolymer is contained in the copolymer in a ratio of 15 mol % to 50% mol.
4. The laminate of claim 2,
wherein a part of the OH group contained in the poly (methacrylic acid-2-hydroxyethyl) is cross-linked to form a three-dimensional mesh structure.
5. A laminate comprising:
a polymer base material having a top surface;
an under coat layer formed on at least a part of the top surface of the polymer base material, having a membranous shape or a film shape and containing an organic polymer;

an adhesive layer formed to cover a top surface of the under coat layer, containing a functional group having nucleophilicity, wherein at least an element ratio O/C which is a ratio between an oxygen O and an carbon C, or an element ratio N/C which is a ratio between a nitrogen N and a carbon C is higher than that of the under coat layer; and an atomic layer deposition layer formed using a precursor as a material thereof to cover a top surface of the adhesive layer, wherein at least a part of the precursor is coupled to the functional group having nucleophilicity.

6. The laminate of claim 5, wherein the under coat layer includes an element or a functional group which contain a non-covalent electron pair.

7. The laminate of claim 5, wherein a film thickness of the adhesive layer is in a range from 0.1 nm to 100 nm.

8. The laminate of claim 5, wherein a film thickness of the under coat layer is in a range from 100 nm to 100 µm.

9. The laminate of claim 5, wherein a film thickness of the atomic layer deposition film is in a range from 2 nm to 50 nm.

10. The laminate of claim 5, wherein the atomic layer deposition film contains at least either Al or Si.

11. The laminate of claim 5, wherein the atomic layer deposition film contains Ti on a top surface that contacts the adhesive layer.

12. A gas barrier film provided with the laminate formed in a film shape according to claim 1.

13. A method of manufacturing laminate comprising steps of:

preparing a base material;

forming an under coat layer on at least a part of a top surface of the base material, having a membranous shape or a film shape and containing an organic polymer having a functional group;

surface-treating a part of an exposed surface of the under coat layer and densifying the functional group of the organic polymer;

supplying a precursor material on the exposed surface such that a precursor that becomes an atomic layer deposition film is coupled to an OH group and a densified functional group of the organic polymer contained in the under coat layer; and removing, from the precursor material, excess precursor material which is not coupled to the under coat layer and saturating a coupling amount of the precursor which is coupled to the OH group of the organic polymer and the densified functional group of the organic polymer, thereby forming the atomic layer deposition film.

14. A method of manufacturing laminate comprising steps of:

preparing a base material;

forming an under coat layer on at least a part of a top surface of the base material, having a membranous shape or a film shape and containing an organic polymer having a functional group;

surface-treating at least a part of an exposed surface of the under coat layer, thereby forming an adhesive layer having a functional group having nucleophilicity;

supplying a precursor material on a top surface of the adhesive layer such that a precursor that becomes an atomic layer deposition film is coupled to the functional group of the under coat layer or the functional group having nucleophilicity of the adhesive layer; and removing, from the precursor material, excess precursor material which is not coupled to the under coat layer and the adhesive layer and saturating a coupling amount of the precursor which is coupled to the functional group of under coat layer or the functional group having nucleophilicity of the adhesive layer, thereby forming the atomic layer deposition film.

15. A method of manufacturing a gas barrier film, wherein the laminate manufactured by the method of manufacturing the laminate according to claim 13 is formed in a film shape.

16. A method of manufacturing a gas barrier film, wherein the laminate manufactured by the method of manufacturing the laminate according to claim 14 is formed in a film shape.

* * * * *